(12) United States Patent
Lim

(10) Patent No.: US 7,842,985 B2
(45) Date of Patent: Nov. 30, 2010

(54) CMOS IMAGE SENSOR

(75) Inventor: Keun Hyuk Lim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/611,915

(22) Filed: Dec. 18, 2006

(65) Prior Publication Data

US 2007/0152291 A1 Jul. 5, 2007

(30) Foreign Application Priority Data

Dec. 29, 2005 (KR) ............... 10-2005-0133165

(51) Int. Cl.
*H01L 31/062* (2006.01)
*H01L 31/113* (2006.01)

(52) U.S. Cl. ............ 257/291; 257/214; 257/215; 257/233; 257/239; 257/258; 257/288; 257/290; 257/461; 257/E27.122; 257/E27.13; 257/E27.133; 438/60; 438/75; 438/144

(58) Field of Classification Search ........... 257/461, 257/290, 233, 258, 291, E27.122, E27.13, 257/E27.133, E27.233; 438/60, 75, 144
See application file for complete search history.

(56) References Cited

U.S. PATENT DOCUMENTS

| | | | | |
|---|---|---|---|---|
| 5,117,270 A | * | 5/1992 | Toda | 257/76 |
| 5,500,383 A | * | 3/1996 | Hynecek | 438/60 |
| 6,107,655 A | | 8/2000 | Guidash | |
| 6,160,281 A | * | 12/2000 | Guidash | 257/292 |
| 6,350,663 B1 | * | 2/2002 | Kopley et al. | 438/448 |
| 6,350,979 B1 | * | 2/2002 | Jing | 250/208.1 |
| 6,881,986 B1 | * | 4/2005 | Chiou et al. | 257/184 |
| 2004/0113151 A1 | * | 6/2004 | Sekine | 257/72 |
| 2004/0218078 A1 | * | 11/2004 | Lee | 348/308 |
| 2004/0256692 A1 | * | 12/2004 | Kunz et al. | 257/500 |
| 2005/0092894 A1 | * | 5/2005 | Fossum | 250/208.1 |
| 2006/0006489 A1 | * | 1/2006 | Park | 257/462 |
| 2006/0255380 A1 | * | 11/2006 | Lee | 257/291 |
| 2006/0284177 A1 | * | 12/2006 | Hynecek | 257/59 |

* cited by examiner

*Primary Examiner*—Lynne A Gurley
*Assistant Examiner*—Meiya Li
(74) *Attorney, Agent, or Firm*—Saliwanchik, Lloyd & Saliwanchik

(57) ABSTRACT

Disclosed is a CMOS image sensor including a gate electrode of a finger type transfer transistor for controlling the saturation state of a floating diffusion region according to the luminance level (i.e. low luminance or high luminance). The CMOS image sensor includes first and second photodiode regions for generating electrons in response to incident light, and a transfer transistor positioned between the first and second photodiodes for receiving the generated electrons transferred from the first and/or second photodiode.

7 Claims, 7 Drawing Sheets

CMOS IMAGE SENSOR

RELATED APPLICATION(S)

This application claims the benefit under 35 U.S.C. §119 (e) of Korean Patent Application No. 10-2005-0133165, filed Dec. 29, 2005, which is incorporated herein by reference in its entirety.

FIELD OF THE INVENTION

The present invention relates to a CMOS image sensor, and more particularly, to a CMOS image sensor for controlling the saturation state of a floating diffusion region according to the degree of luminance.

BACKGROUND OF THE INVENTION

In general, an image sensor is a semiconductor device for converting optical images into electric signals and is mainly classified as a charge coupled device (CCD) image sensor or a CMOS image sensor.

However, a CCD has a complicated driving manner, high power consumption, and requires a multi-step photo process, which makes the manufacturing process thereof complicated.

For this reason, a CMOS image sensor has recently been spotlighted as the next-generation image sensor capable of overcoming the defects of the charge coupled device.

A CMOS image sensor is a device employing a switching mode to sequentially detect an output of photodiodes by providing MOS transistors corresponding to each unit pixel in conjunction with peripheral devices, such as a control circuit and a signal processing circuit.

That is, a CMOS image sensor with a photodiode and a MOS transistor within each pixel sequentially detects the electric signals of each unit pixel in a switching scheme to realize an image.

Since a CMOS image sensor is manufactured by utilizing CMOS technology, it has the advantage of relatively low power consumption. In addition, since a smaller number of photolithography steps is required, the manufacturing process of a CMOS image sensor can be simplified.

Further, since a control circuit, a signal processing circuit, an analog/digital converting circuit, and the like can be integrated on a single CMOS image sensor chip, the CMOS image sensor can minimize the size of a product.

Accordingly, a CMOS image sensor is widely used in various applications including digital still cameras, and digital video cameras.

CMOS image sensors are classified as a 3T type CMOS image sensor, a 4T type CMOS image sensor, or a 5T type CMOS image sensor according to the number of transistors formed in each unit pixel. The 3T type CMOS image sensor includes one photodiode and three transistors, and the 4T type CMOS image sensor includes one photodiode and four transistors.

FIG. 1 is an equivalent circuit diagram of a conventional 4T type CMOS image sensor, and FIG. 2 is a layout illustrating a unit pixel of the 4T type CMOS image sensor.

As illustrated in FIGS. 1 and 2, the unit pixel of the CMOS image sensor includes a photodiode 10 and four transistors. In particular, the unit pixel includes a photodiode 10 for receiving light and generating electrons formed at the wide region of the active area; a transfer transistor 20 for transferring electrons collected at the photodiode (PD) 10 to a floating diffusion (FD) region; a reset transistor 30 for setting electric potential at the floating diffusion (FD) region to a desired value and for exhausting electric potential to reset the floating diffusion (FD) region; a source follow transistor 40 functioning as a source follow buffer amplifier; and a select transistor 50 functioning as a switch for addressing.

Furthermore, as shown in FIG. 1, a load transistor 60 is formed at an output terminal (Vout) of each unit pixel 100 to read an output signal.

Referring to FIG. 1, Tx is a gate voltage applied to the transfer transistor 20, Rx is a gate voltage applied to the reset transistor 30, Dx is a gate voltage applied to the source follow transistor 40, and Sx is a gate voltage applied to the select transistor 50.

FIG. 3 is a cross-sectional view of the CMOS image sensor taken along the line II-II' illustrated in FIG. 2.

Referring to FIG. 3, the CMOS image sensor includes an isolation layer 62 formed at an isolation region of a semiconductor substrate 61 on which the active area and the isolation region are defined; a gate electrode 64 formed on a predetermined area of the active area of the semiconductor substrate 61 isolated by the isolation layer 62 with a gate insulating layer 63 formed therebetween; a photodiode region 65 formed in an upper portion of the semiconductor substrate 61 at one side of the gate electrode 64; a floating diffusion region 66 formed in an upper portion of the semiconductor substrate 61 at the other side of the gate electrode 64; and an insulating layer sidewall 67 formed at both sides of the gate electrode 64.

FIG. 4 illustrates the operation of the transfer transistor shown in FIG. 3.

Referring to FIG. 4, the amount of responsive light may be determined by means of the capacitance of the photodiode (PD) region 65 and the capacitance of the floating diffusion (PD) region 66.

When the amount of an incident light through the photodiode (PD) region 65 is large enough, the floating diffusion (FD) region 66 can saturate and no more reaction proceeds. When the amount of the incident light is too small, the amount of the generated electrons (e) is too small and a sufficient reaction does not occur.

BRIEF SUMMARY

An embodiment of the present invention can provide a CMOS image sensor utilizing a transfer transistor incorporating a finger type gate electrode.

According to embodiments of the CMOS image sensor of the present invention, a floating diffusion region can be formed between photodiode regions to prevent the saturation of the floating diffusion region and to improve the reliability of the operation.

Accordingly, there is provided a CMOS image sensor comprising first and second photodiode regions for generating electrons in response to incident light and a transfer transistor for receiving the generated electrons transferred from the first and/or second photodiode. In addition, the transfer transistor can be positioned between the first and second photodiodes.

In the preferred embodiment of the present invention, the transfer transistor can be a finger type transistor.

According to the preferred embodiment of the present invention, the transfer transistor can be a finger type transistor having a first gate electrode and a second gate electrode.

In a further preferred embodiment, a floating diffusion region can be provided between the first electrode and the second gate electrode.

In addition, the first gate electrode can be adjacent to the first photodiode and the second gate electrode can be adjacent to the second photodiode in the preferred embodiment of the present invention.

The channel length of the first gate electrode and the channel length of the second gate electrode can be different lengths in a preferred embodiment of the present invention.

According to embodiments of the present invention, a high voltage can be applied to the first and second gate electrodes to turn on the first and second gate electrodes when a low luminance is applied, and a low voltage can be applied to the first and second gate electrodes to turn on the first gate electrode and to turn off the second gate electrode when a high luminance is applied.

DETAILED DESCRIPTION OF THE INVENTION

Hereinafter, the CMOS image sensor according to preferred embodiments of the present invention and the method of manufacturing the same will be described in detail referring to the attached drawings.

Figure 1:
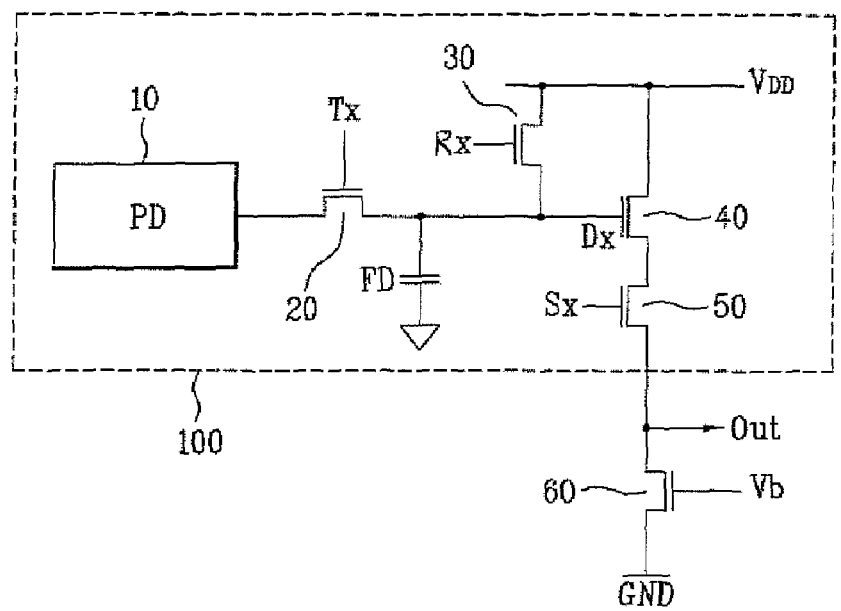
FIG. 1 is an equivalent circuit diagram of the conventional 4T type CMOS image sensor.
Figure 2:
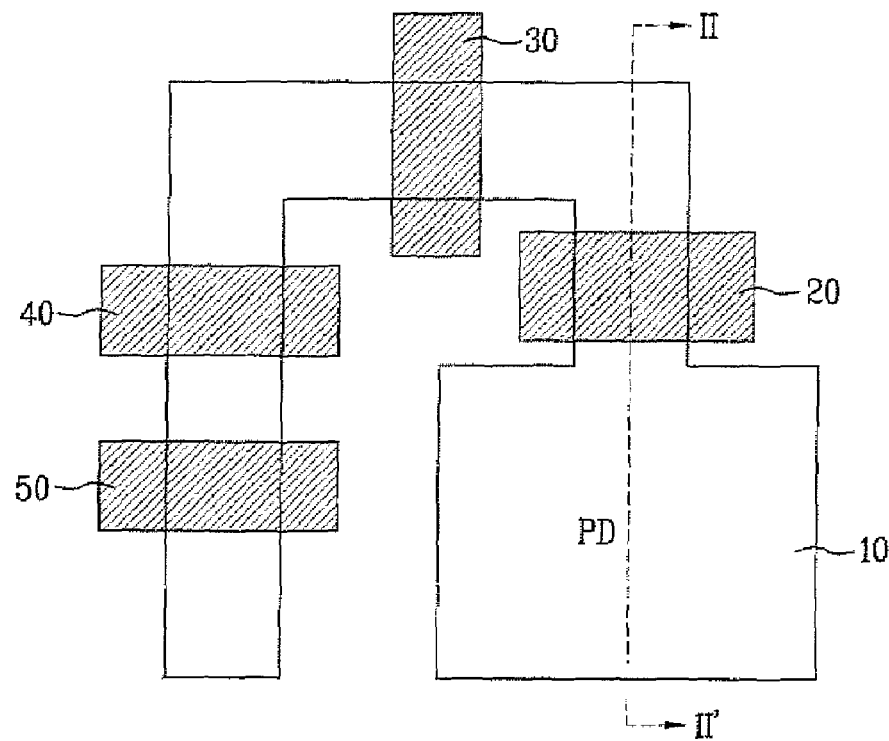
FIG. 2 is a layout diagram illustrating a unit pixel of the conventional 4T type CMOS image sensor.
Figure 3:
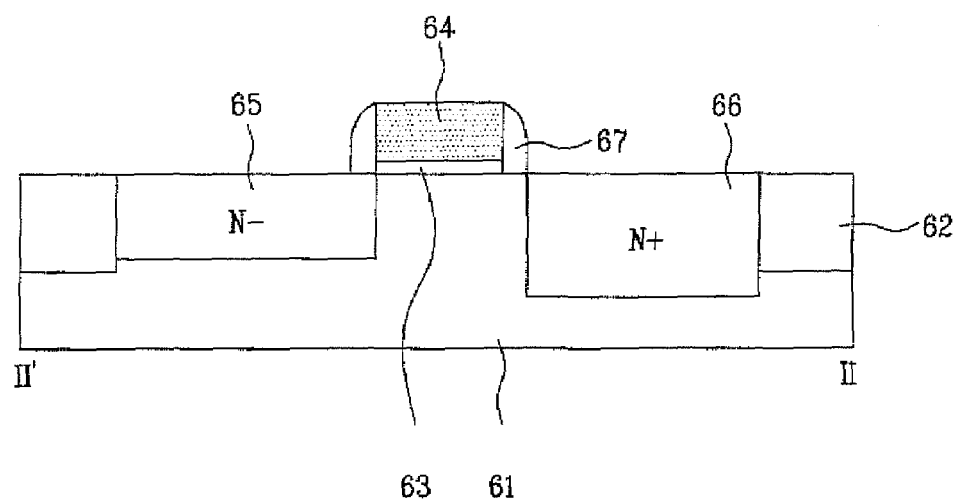
FIG. 3 is a cross-sectional view of the CMOS image sensor taken along the line II-II' of FIG. 2.
Figure 4:
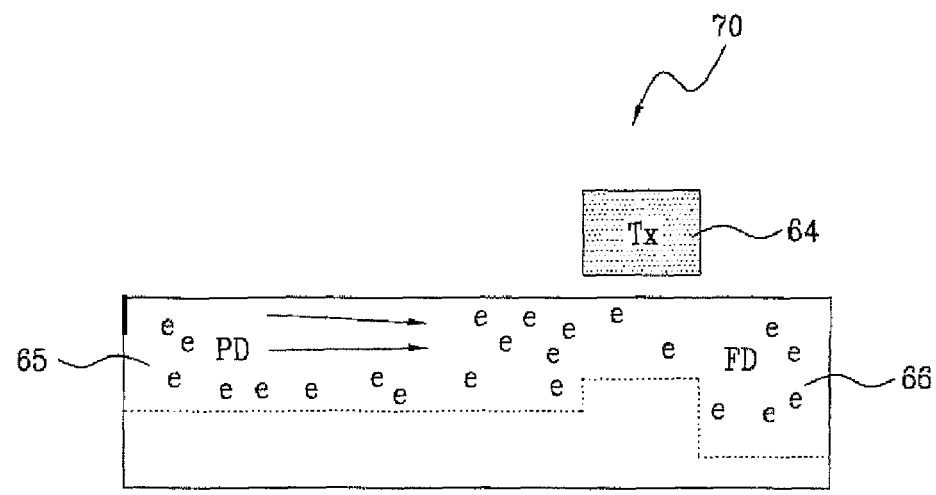
FIG. 4 illustrates the operation of a transfer transistor for the conventional CMOS image sensor.
Figure 5:
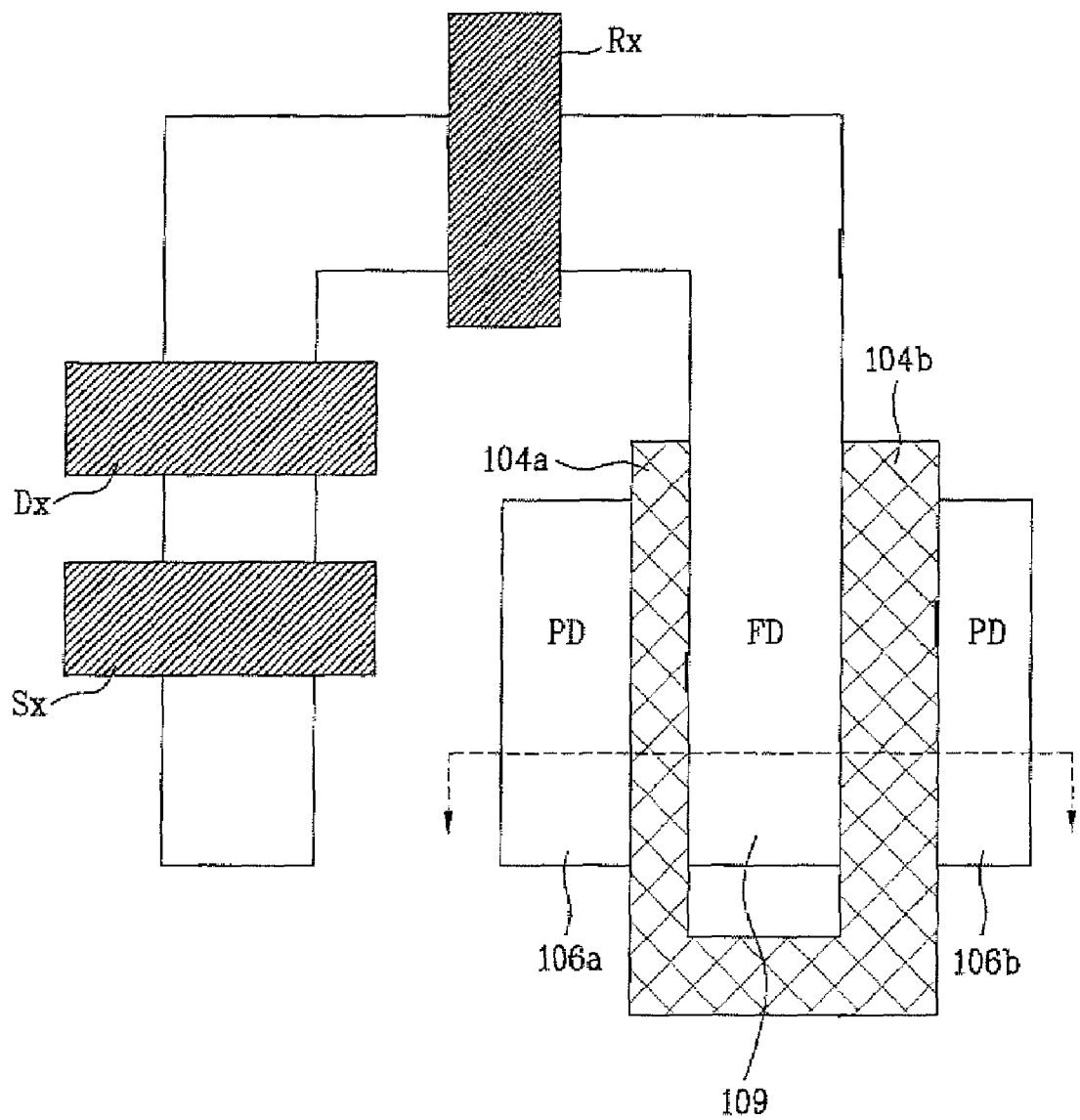
FIG. 5 is a layout of a unit pixel of a 4T type CMOS image sensor according to an embodiment of the present invention.
Figure 6:
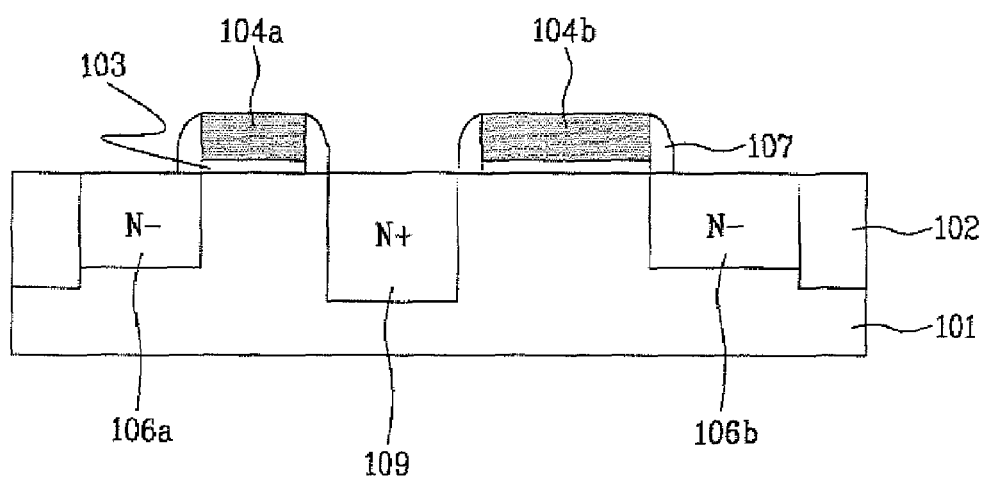
FIG. 6 is a cross-sectional view taken along the line VI-VI' of FIG. 5 according to an embodiment of the present invention.

FIG. 5 is a layout for illustrating the unit pixel of a 4T type CMOS image sensor according to an embodiment of the present invention, and FIG. 6 is a cross-sectional view taken along the line VI-VI' of FIG. 5.

In FIGS. 5 and 6, the drawings illustrate the structure of the transfer transistor of the finger type suggested in an embodiment of the present invention.

As illustrated in the drawings, an isolation layer 102 for defining an active area and an isolation region can be formed on a semiconductor substrate 101.

On the active area of the semiconductor substrate 101, first and second gate electrodes 104a and 104b can be formed on a gate insulating layer 103. That is, a finger type gate electrode can be formed.

The region of semiconductor substrate 101 between the first and second gate electrodes 104a and 104b can correspond to a floating diffusion region 109.

The regions of semiconductor substrate 101 at the left and right sides of the first and second gate electrodes 104a and 104b can correspond to photodiode regions 106a and 106b.

Referring to FIG. 6, an insulating layer sidewall 107 can be formed at both sides of the first and the second gate electrode 104a and 104b.

In a specific embodiment, the channel length of the first and second gate electrodes 104a and 104b can be formed to be different from each other.

As illustrated in FIG. 5, one terminal portion of the first and second gate electrodes 104a and 104b can be electrically connected to form a finger type structure.

FIGS. 7A-7D are cross-sectional views for illustrating the method of manufacturing the CMOS image sensor according to an embodiment of the present invention. Particularly, a method of manufacturing a transfer transistor of a finger type is illustrated in these drawings.

Figure 7A:
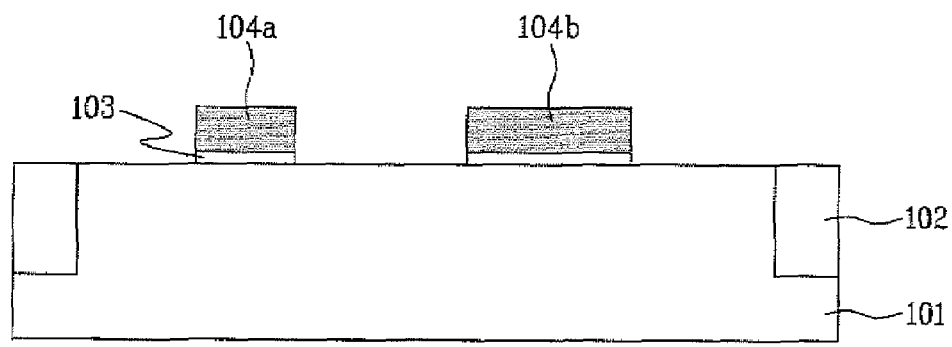
FIGS. 7A-7D are cross-sectional views for illustrating the method of manufacturing the CMOS image sensor according to an embodiment of the present invention.

Referring to FIG. 7A, an isolation layer 102 can be formed to isolate devices on a semiconductor substrate 101.

Then, a gate insulating layer 103 and a conductive layer (for example, a high concentration poly-silicon layer) can be successively deposited on the whole surface of the semiconductor substrate 101 including the isolation layer 102.

Here, the gate insulating layer 103 can be formed by a thermal oxidation process or a CVD method.

After that, the conductive layer and the gate insulating layer 103 can be selectively removed to form a gate electrode for each transistor.

The gate electrode of the transfer transistor can be formed as a finger type. In particular, first and second gate electrodes 104a and 104b can be formed with a constant interval in between the finger sections while crossing an active region of the semiconductor substrate 101 as illustrated in FIG. 7A. In a preferred embodiment, the fingers 104a and 104b can be formed with different channel lengths.

In a specific embodiment, the channel length of the second gate electrode 104b can be twice as long as the channel length of the first gate electrode 104a.

According to an embodiment of the present invention, the applied voltage onto the first and second gate electrodes 104a and 104b can be different from each other. In a specific embodiment, the transfer transistor can be selectively turned on by applying a high voltage when the light is weak and applying a low voltage when the light is strong.

In addition, output signals can be amplified respectively to different gain according to the applied voltage to the transfer transistor.

One terminal of the first and second gate electrodes 104a and 104b can be electrically connected and can have a finger type structure as illustrated in FIG. 5.

Figure 7B:
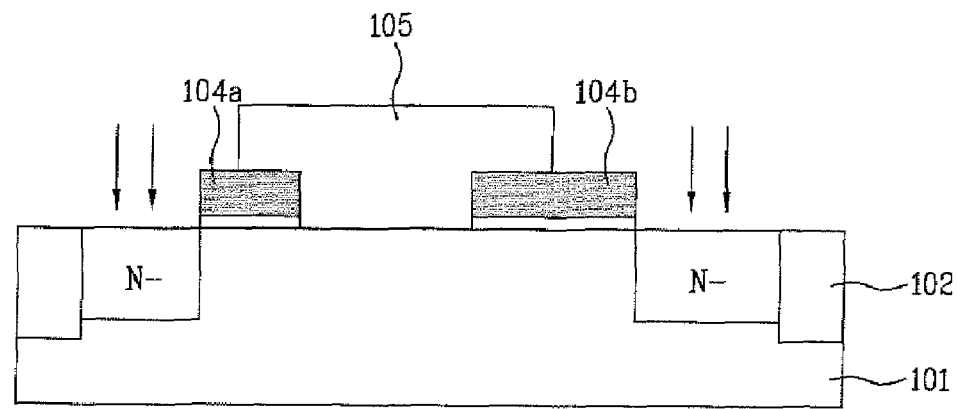

Referring to FIG. 7B, a first photoresist pattern 105 can be formed by coating a photoresist on the whole surface of the semiconductor substrate 101, including the first and second gate electrodes 104a and 104b, and then performing an exposing process and a developing process to cover the semiconductor substrate 101 between the first gate electrode 104a and the second gate electrode 104b.

First and second photodiode regions 106a and 106b can be formed by implanting low concentration n-type impurity ions into the exposed active area of the semiconductor substrate 101 using the first photoresist pattern 105 as a mask.

Here, the first and second photodiode regions 106a and 106b can be formed outside of the first and second gate electrodes 104a and 104b, other than the region between the first and second gate electrodes 104a and 104b.

Figure 7C:
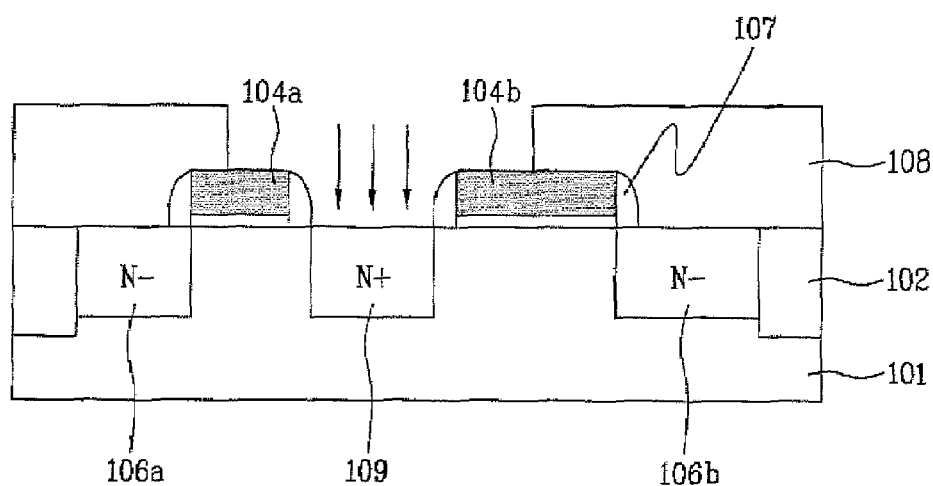

Referring to FIG. 7C, the first photoresist pattern 105 can be completely removed and an insulating layer can be formed on the whole surface of the semiconductor substrate 101.

In a specific embodiment, the insulating layer can be formed as a single layer or an integrated layer of a nitride layer and a TEOS oxide layer.

Subsequently, an anisotropic etching (RIE) can be performed to form an insulating layer sidewall 107 at both sides of the first and second gate electrodes 104a and 104b.

Next, a second photoresist pattern 108 can be formed by coating a photoresist on the whole surface of the semiconductor substrate 101 including the insulating layer sidewalls 107, and then performing an exposing and developing process to expose the source/drain region of each transistor.

A source/drain impurity region can be formed by implanting high concentration n+ type impurity ions into the exposed source/drain region using the second photoresist pattern 108 as a mask.

At this time a floating diffusion region 109, which is a drain impurity region of the transfer transistor, can be formed at the active area between the first gate electrode 104a and the second gate electrode 104b.

That is, the floating diffusion region 109 can be formed between the first and second photodiode regions 106a and 106b according to an embodiment of the present invention.

Figure 7D:
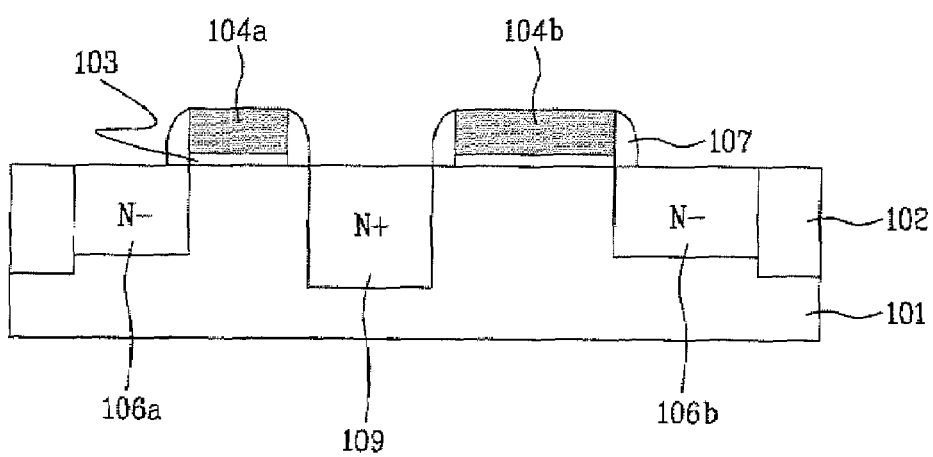

Referring to FIG. 7D, the second photoresist pattern 108 can be removed. Then, an annealing process can be performed to diffuse various impurity ions implanted into the semiconductor substrate 101.

Figure 8A:
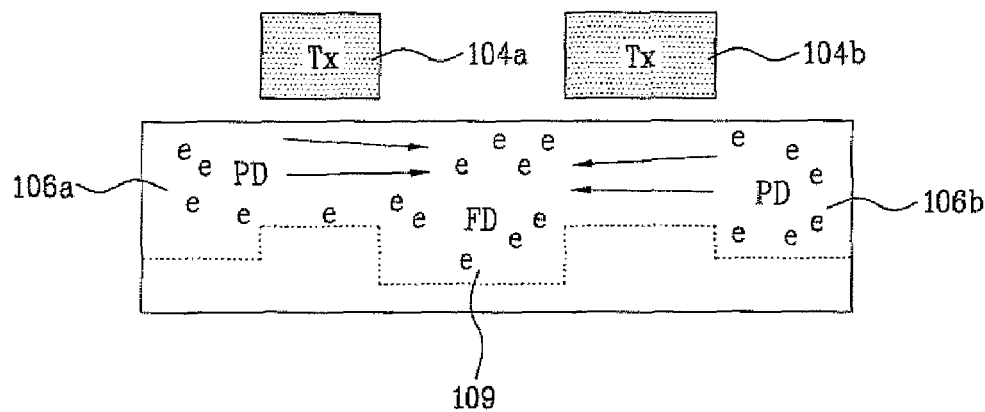
FIGS. 8A and 8B illustrate the operation of the transfer transistor of the CMOS image sensor according to an embodiment of the present invention.
Figure 8B:
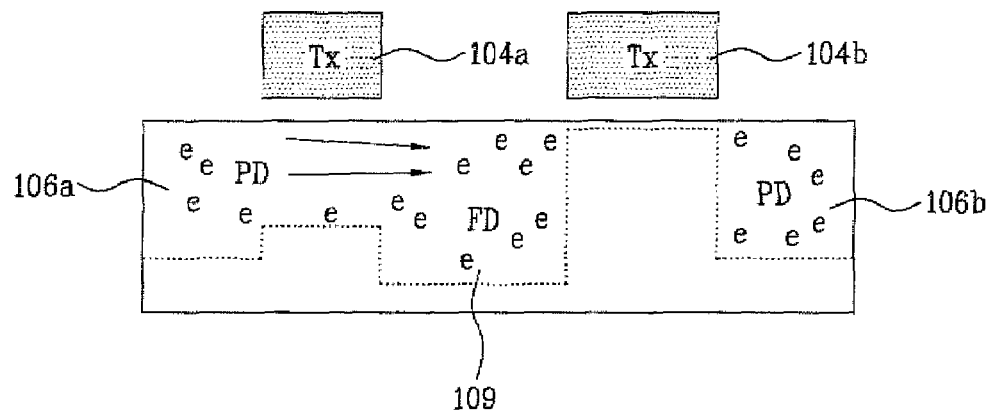

FIGS. 5A and 8B illustrate the operation of the transfer transistor constituting the CMOS image sensor according to embodiments of the present invention.

The CMOS image sensor described in FIGS. 5A and 5B can incorporate first and second gate electrodes 104a and 104b formed on a semiconductor substrate and separated by a predetermined interval. The first and second gate electrodes 104a and 104b of a transfer transistor can be finger type. A floating diffusion region (FD) 109 can be formed at an upper portion of the semiconductor substrate 101 between the first and second gate electrodes 104a and 104b.

In addition, first and second photodiode regions 106a and 106b can be formed at both sides of the floating diffusion region 109.

Accordingly, the gate electrode of the transfer transistor in the CMOS image sensor of an embodiment of the present invention can be formed as a finger type and the photodiode region can be divided into two photodiode regions. A floating diffusion region can be formed between the divided photodiode regions to improve the reaction at a low luminance and at a high luminance.

Referring to FIG. 5A, both the first and second gate electrodes 104a and 104b can be turned on by applying a high voltage at a low luminance. Therefore, the floating diffusion region (FD) 109 can receive all the electrons generated at the first and second photodiode regions 106a and 106b.

Referring to FIG. 8B, only the first gate electrode 104a is turned on by applying a low voltage at the high luminance when a sufficient light is applied. Therefore, the floating diffusion region (FD) 109 only receives the electrons generated at the first photodiode region 106a to generate corresponding electric signals.

That is, under a low luminance, both the first and second photodiode regions 106a and 106b can be utilized to improve the sensitivity in an embodiment of the present invention. In addition, under a high luminance of a large amount of light, only the first photodiode region 106a may be utilized. Accordingly, the saturation phenomenon of the floating diffusion region can be prevented.

As described in detail above, the CMOS image sensor and the method of manufacturing the same according to embodiments of the present invention can provide the following characteristics.

First, the gate electrode of the transfer transistor can be formed as a finger type and the photodiode region can be divided into two photodiode regions. Between the divided photodiode regions, a floating diffusion region can be formed to improve the reaction at a low luminance and at a high luminance.

Second, since the saturation level at the floating diffusion region can be heightened, the operation at a large amount of light is possible, and the operation range improves.

Although a preferred embodiment of the present invention has been described for illustrative purposes, those skilled in the art will appreciate that various modifications, additions and substitutions are possible, without departing from the scope and spirit of the invention as disclosed in the accompanying claims.

I claim:

1. A CMOS image sensor comprising:
   first and second photodiode regions for generating electrons in response to incident light; and
   a transfer transistor of the CMOS image sensor positioned between the first and second photodiode regions for receiving the generated electrons transferred from the first and second photodiode regions, wherein the transfer transistor has a first gate electrode and a second gate electrode in a same pixel of the CMOS image sensor; and
   a floating diffusion region between the first gate electrode and the second gate electrode,
   wherein an end part of the first gate electrode and an end part of the second gate electrode are extended to an outer region of the floating diffusion region and are connected to each other to surround the floating diffusion region to form "U"-type finger structure in a single layer,
   wherein the first and second photodiode regions are spaced apart and separated from each other by the transfer transistor positioned therebetween.

2. The CMOS image sensor according to claim 1, wherein the first gate electrode is adjacent to the first photodiode region and the second gate electrode is adjacent to the second photodiode region.

3. The CMOS image sensor according to claim 2, wherein a channel length of the first gate electrode and a channel length of the second gate electrode are different from each other.

4. The CMOS image sensor according to claim 3, wherein both the first and second gate electrodes are capable of being turned on by applying a high voltage during a low luminance, and wherein the first gate electrode is capable of being turned on while the second gate electrode remains turned off by applying a low voltage during a high luminance.

5. A CMOS image sensor comprising:
   first and second photodiode regions for generating electrons in response to incident light; and
   a transfer transistor of the CMOS image sensor positioned between the first and second photodiode regions for receiving the generated electrons transferred from the first and second photodiode regions, wherein the transfer transistor has a first gate electrode and a second gate electrode in a same pixel of the CMOS image sensor;
   a floating diffusion region between the first gate electrode and the second gate electrode,
   wherein an end part of the first gate electrode and an end part of the second gate electrode are extended to an outer region of the floating diffusion region and are connected to each other to surround the floating diffusion region to form "U"-type finger structure in a single layer,
   wherein a channel length of the second gate electrode is twice as long as a channel length of the first gate electrode,
   wherein the first and second photodiode regions are spaced apart and separated from each other by the transfer transistor positioned therebetween.

6. The CMOS image sensor according to claim 5, wherein the first gate electrode is adjacent to the first photodiode region and the second gate electrode is adjacent to the second photodiode region.

7. The CMOS image sensor according to claim 5, wherein both the first and second gate electrodes are capable of being turned on by applying a high voltage during a low luminance, and wherein the first gate electrode is capable of being turned on while the second gate electrode remains turned off by applying a low voltage during a high luminance.

* * * * *